(12) United States Patent
Nguyen

(10) Patent No.: US 7,309,647 B1
(45) Date of Patent: Dec. 18, 2007

(54) METHOD OF MOUNTING AN ELECTROLESS NICKEL IMMERSION GOLD FLIP CHIP PACKAGE

(75) Inventor: My Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 150 days.

(21) Appl. No.: 11/172,180

(22) Filed: Jun. 29, 2005

Related U.S. Application Data

(60) Division of application No. 10/775,370, filed on Feb. 9, 2004, now Pat. No. 6,992,397, which is a continuation of application No. 10/382,784, filed on Mar. 5, 2003, now Pat. No. 6,756,687.

(51) Int. Cl.
*H01L 21/44* (2006.01)
(52) U.S. Cl. ............... 438/612; 438/613; 257/772; 257/E23.023; 257/779; 257/E21.508
(58) Field of Classification Search ............ 438/51, 438/64, 106, 612, 613; 257/738, 772, 779 257/E23.023, E21.508
See application file for complete search history.

(56) References Cited

U.S. PATENT DOCUMENTS

| | | | | |
|---|---|---|---|---|
| 5,011,658 A | * | 4/1991 | Niedrich | 420/558 |
| 6,286,206 B1 | | 9/2001 | Li | |
| 6,307,160 B1 | * | 10/2001 | Mei et al. | 174/256 |
| 6,445,069 B1 | | 9/2002 | Ling et al. | |
| 2002/0045036 A1 | | 4/2002 | Gorrell et al. | |
| 2002/0157241 A1 | | 10/2002 | Yamamoto | |
| 2002/0157247 A1 | | 10/2002 | Li | |

OTHER PUBLICATIONS

Goyal, et al, "Failure Mechanism of Brittle Solder Joint Fracture in the Presence of Electroless Nickel Immersion Gold (ENIG) Interface", Proceedings of the 52$^{nd}$ Electronic Component and Technology Conference, 732-739, May 2002.
Binary Alloy Phase Diagrams Binary Alloy Phase Diagrams, 2$^{nd}$ ed, Dec. 1990, T.B.B. Massalski (Editor), L. Kacprzak (Editor), H. Okamoto (Editor), P.R. Subramanian (Editor), pp. 2269, 2642, 2644, 2294, 2996, 1449, 1451, 1746-1748.

* cited by examiner

*Primary Examiner*—Quoc Hoang
(74) *Attorney, Agent, or Firm*—Beyer Weaver LLP

(57) ABSTRACT

A flip chip package, apparatus and technique in which a ball grid array composed of a doped eutectic Pb/Sn solder composition is used. The dopant in the Pb/Sn solder forms a compound or complex with the phosphorous residue from the electroless nickel plating process that is mixable with the Pb/Sn solder. The phosphorous containing compound or complex prevents degradation of the solder/under bump metallization bond associated with phosphorus residue. The interfacial solder/under bump metallization bond is thereby strengthened. This results in fewer fractured solder bonds and greater package reliability.

17 Claims, 7 Drawing Sheets

METHOD OF MOUNTING AN ELECTROLESS NICKEL IMMERSION GOLD FLIP CHIP PACKAGE

CROSS-REFERENCE TO RELATED APPLICATIONS

This application is a divisional of U.S. patent application Ser. No. 10/775,370 filed Feb. 9, 2004 U.S. Pat. No. 6,992, 397, titled ELECTROLESS NICKEL IMMERSION GOLD SEMICONDUCTOR FLIP CHIP PACKAGE; which is a continuation of U.S. patent application Ser. No. 10/382,784 filed Mar. 5, 2003, titled INTERFACIAL STRENGTHENING FOR ELECTROLESS NICKEL IMMERSION GOLD SUBSTRATES; (now U.S. Pat. No. 6,756,687, issued Jun. 29, 2004); which are incorporated herein by reference in their entirety and for all purposes.

BACKGROUND OF THE INVENTION

1. Field of the Invention

This invention relates generally to integrated circuit packaging, and in particular to flip chip packaging. More specifically, the invention relates to compositions and techniques for strengthening the interfacial bond between a flip chips package substrate and the solder balls used for external electrical connection of the completed flip chip package.

2. Description of Related Art

In integrated circuit packaging, a semiconductor die (also referred to as an integrated circuit (IC) or "chip") may be bonded directly to a packaging substrate, without the need for a separate leadframe or for separate I/O connectors (e.g., wire or tape). Such chips are formed with ball-shaped beads or bumps of solder affixed to their I/O bonding pads. During packaging, the chip is "flipped" onto its active circuit surface so that the solder bumps form electrical connections directly between the chip and conductive traces on the packaging substrate. Semiconductor chips of this type are commonly called "flip chips."

Integrated circuits are normally mounted on a printed circuit board (PCB) for use in an electronic device. Electrical connections of a flip chip package are generally made via a solder ball grid array (BGA) formed on the opposite side (referred to herein as the underside) of the packaging substrate from the chip. An unmounted flip chip package with a BGA arranged on its underside is aligned with a PCB and the package and board are then electrically connected in a solder reflow operation in which the solder is heated above its melting temperature and bonds with electrical contacts on the board upon cooling.

As semiconductor technology advances, the gate density of integrated circuits has increased. The substrate of choice for high density flip chip packages is produced by electroless nickel immersion gold (ENIG) technology. ENIG deposition processes provide flat, uniform metal surface finishes with excellent solderability, hardness, wear and corrosion resistance. As a result, ENIG processing has become widespread in BGA component packaging.

Unfortunately, it has been discovered that some solder joints in the BGA become fractured after surface mounting of the BGA package on a PCB where ENIG processing is used (See, for example, Goyal, et al., "Failure Mechanism of Brittle Solder joint Fracture in the Presence of Electroless Nickel Immersion Gold (ENIG) Interface," Proceedings of the 52$^{nd}$ Electronic Component and Technology Conference, 732-739 (May, 2002)). The fracture occurs at the interface of a solder joint and the ENIG deposited surface. The cause of the fracture and/or susceptibility to fracture has been identified as residual phosphorus from the ENIG process that results in formation of a nickel-phosphorus layer at the nickel solder interface. Such brittle, interfacial solder joint fractures represent a significant reliability issue for high density flip chip package components. Nevertheless, ENIG processed flip chip package substrates have become standard in the industry and thus their continued use would be desirable.

Accordingly, what is needed are compositions and/or methods to reduce the occurrence of brittle, interfacial solder joint fractures at ENIG processed flip chip package substrates and PCBs.

SUMMARY OF THE INVENTION

To achieve the foregoing, the present invention provides a flip chip package, apparatus and technique in which a ball grid array composed of a doped eutectic Pb/Sn solder composition is used. The dopant in the Pb/Sn solder forms a compound or complex with the phosphorous residue from the electroless nickel plating process that is mixable with the Pb/Sn solder. The phosphorous containing compound or complex. The phosphorous containing compound or complex prevents degradation of the solder/under bump metallization bond associated with phosphorus residue. The interfacial solder/under bump metallization bond is thereby strengthened. This results in fewer fractured solder bonds and greater package reliability. The amount of the metal dopant is generally greater than 0.2% by weight, for example about 0.2% to 2.5%, or about 2%. Sample dopants include Al, Fe, Ni, Cu, Zn, Mo and In. An electronic device composed of a package in accordance with the invention mounted on a printed circuit board, and a method of making such an electronic device are also provided.

These and other features and advantages of the present invention are described below where reference to the drawings is made.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a flip chip package, apparatus and technique in which a ball grid array composed of a doped eutectic Pb/Sn solder composition is used. The dopant in the Pb/Sn solder forms a compound or complex with the phosphorous residue from the electroless nickel plating process that is mixable with the Pb/Sn solder. The phosphorous containing compound or complex prevents degradation of the solder and the under bump metallization bond associated with phosphorus residue. The interfacial solder/under bump metallization bond is thereby strengthened. This results in fewer fractured solder bonds and greater package reliability.

Figure 1A:
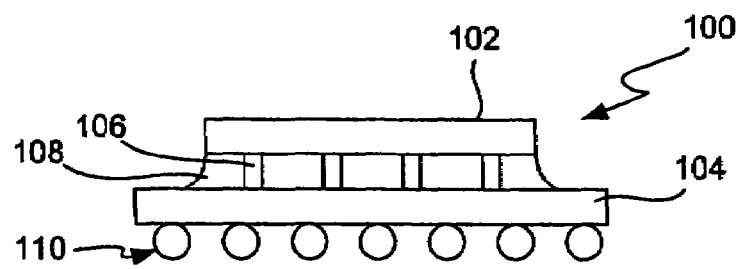
FIG. 1A depicts a cross-sectional view of a flip chip package in accordance with one embodiment of the present invention.

FIG. 1A shows a cross-sectional view of a flip chip package in accordance with one embodiment of the present invention. The package 100 includes a flip chip (die) 102 electrically connected on its active circuit surface to conductive traces on the chip side of an electroless nickel immersion gold packaging substrate 104 by solder bonds 106. The flip chip may be of any type, but is typically a silicon-based composite. In specific embodiments the package includes a high density flip chip, for example, the APEX™ EP20K400EFC672, available from Altera Corporation, San Jose, Calif. The solder for the chip to substrate bonds is typically a high Pb solder with a reflow temperature greater than that for the solder used for the BGA so that the chip-substrate solder bond is not compromised during heating to reflow the BGA solder when the package is subsequently connected to a printed circuit board (PCB). For example, a high Pb solder with a reflow temperature of 200° C. or more may be used.

An underfill material 108 is also generally applied between the chip 102 and the substrate 104 to strengthen the mechanical connection between the chip and the substrate and relieve some of the stress on the solder bonds during temperature cycling due to the different coefficients of thermal expansion (CTEs) of the chip 102 and substrate 104. A suitable underfill is typically a thermo-set epoxy, such as is available from Hysol Corporation of Industry, California (e.g., product numbers 4549, 8439), Ablestik Laboratories of Rancho Domingo, Calif., or Namics, Reno, Nev. (e.g., product no. 8439-1). In a typical procedure, a bead of thermo-set epoxy, is applied along one edge of the die where it is drawn under the die by capillary action until it completely fills the gap between the die and the packaging substrate. Slight heating of the packaging substrate during dispensing of the underfill epoxy may assist the flow. In some cases, the underfill epoxy flow is further assisted by vacuum, or, alternatively, by injection of the epoxy into the gap. Once in place between the chip and substrate, the underfill is heat cured.

The packaging substrate is typically composed of an organic or laminate material such as fiber glass, PTFE, BT resin, epoxy laminates or ceramic-plastic composites with conductive metallization in and on the material to provide an electrical path from the chip through the substrate and to the PCB. In accordance with the present invention, an electroless nickel immersion gold (ENIG) substrate is used. Suitable ENIG flip chip packaging substrates are available from Kyocera, Kyoto, Japan, for example. An array of solder balls (solder ball grid array (BGA)) 110 is formed on under bump metallization (UBM) of the substrate 104 to provide the electrical bonding between the substrate 104 and a PCB.

Figure 1B:
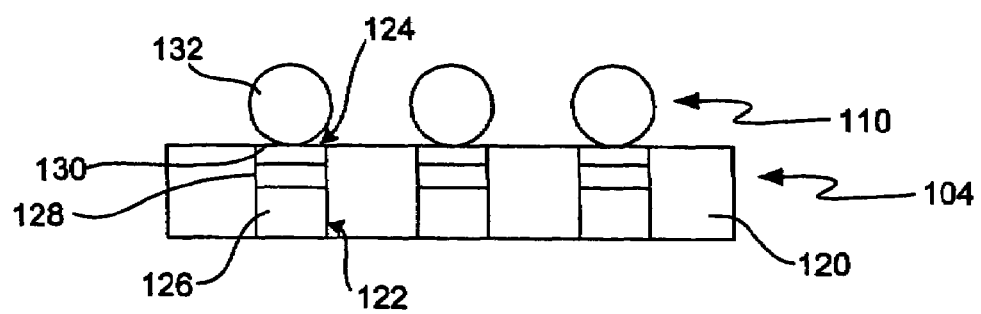
FIG. 1B depicts a more detailed cross-sectional view of the substrate and BGA of the package of FIG. 1A.

FIG. 1B depicts a more detailed cross-sectional view of the substrate and BGA of the package of FIG. 1A, illustrating features of an ENIG substrate suitable for use in accordance with the present invention with a ball grid array. The substrate 104 includes a plurality of vias 122 in a base organic material 120. The vias 122 contain layers of conductive metals referred to as the substrate's under bump metallization (UBM) 124. The bulk of the metal of the UBM 124 is copper (Cu) 126 having a thickness of, for example about 0.6 to 1.4 mm. Above the copper 126, is deposited a layer of nickel 128. The nickel layer 128 enhances the bond between the solder balls 132 of the BGA and the and the UBM 124. It is generally a thin layer, for example about 2 microns. The nickel is covered by a very thin (e.g., less then about 0.1 micron) layer of gold (Au) 130 to provide protection to the nickel 128 from oxidation or corrosion.

The nickel 128 and gold 130 layers of the UBM 123 are formed by an electroless nickel immersion gold (ENIG) process. ENIG deposition processes provide flat, uniform metal surface finishes with excellent solderability, hardness, wear and corrosion resistance. However, as noted above, a byproduct of the ENIG process, particularly of the electroless nickel process, is a phosphorus residue. This phosphorus residue has been found to degrade the interfacial strength of the solder bonds at their interface with the UBM.

The solder balls of the BGA of packages in accordance with the present invention are formulated to address this issue. They are composed of a doped lead/tin (Pb/Sn) eutectic solder. Suitable eutectic Pb/Sn bulk solder compositions are well known in the art and are available from Senju Metal Industry Co., Ltd., Tokyo, Japan; Alpha Metals, Inc., Jersey City, N.J.; and Duksan Hi-Metal Co., Ltd., Ulsan-city, Korea, for example. Such a bulk solder contains a eutectic mixture of about 63% tin (Sn) and about 37% lead (Pb) and a variety of other elements present in trace amounts, generally less than 0.02%. The dopant is selected so that it is capable of forming a compound or complex with the phosphorous residue from the electroless nickel plating process that is mixable with the Pb/Sn solder. Suitable dopants in accordance with the present invention include iron (Fe), copper (Cu), zinc (Zn), indium (In), molybdenum (Mo), nickel (Ni) and aluminum (Al). FIGS. 2A-E provide phase diagrams which illustrate the ability of various dopant materials (Cu, Zn, In, Mo, and Fe, respectively) used in accordance with the present invention to react/complex with phosphorus (Binary Alloy Phase Diagrams Binary Alloy Phase Diagrams, 2nd ed, December 1990 T. B. B. Massalski (Editor), L. Kacprzak (Editor), H. Okamoto (Editor), P. R. Subramanian (Editor)). Generally, any material that forms a compound or complex with the phosphorous residue from the electroless nickel plating process that is mixable with Pb/Sn solder during reflow may be used.

While some of the described elements may be present in trace amounts in conventional Pb/Sn eutectic solders, when used as dopants in accordance with the present invention they are used in much greater than these trace amounts so that they are present in a sufficient amount to react or complex with most or all of the phosphorus residue present. In general, at least about 0.2% dopant by weight of the final solder composition, for example an amount of between about 0.2 to 2.5% may be used. In one preferred embodiment, about 2% dopant is used. This amount is generally sufficient to have the desired effect with regard to the phosphorus residue without being so much as to substantially alter the eutectic properties of the solder.

The phosphorous containing compound or complex should be mixable with the bulk solder so as to fortify the solder/UBM interface. In a preferred embodiment, the phosphorous containing compound or complex disperses in the bulk solder so that there is insufficient phosphorous at the interface of the solder and the under bump metallization to degrade the bond. It is also possible that a phosphorus containing compound or complex remains at the solder/UMB interface and participates in the formation of a strong solder/UBM bond. In either case, the interfacial solder/under bump metallization is thereby strengthened. This results in fewer fractured solder bonds and greater package reliability.

Figure 3:
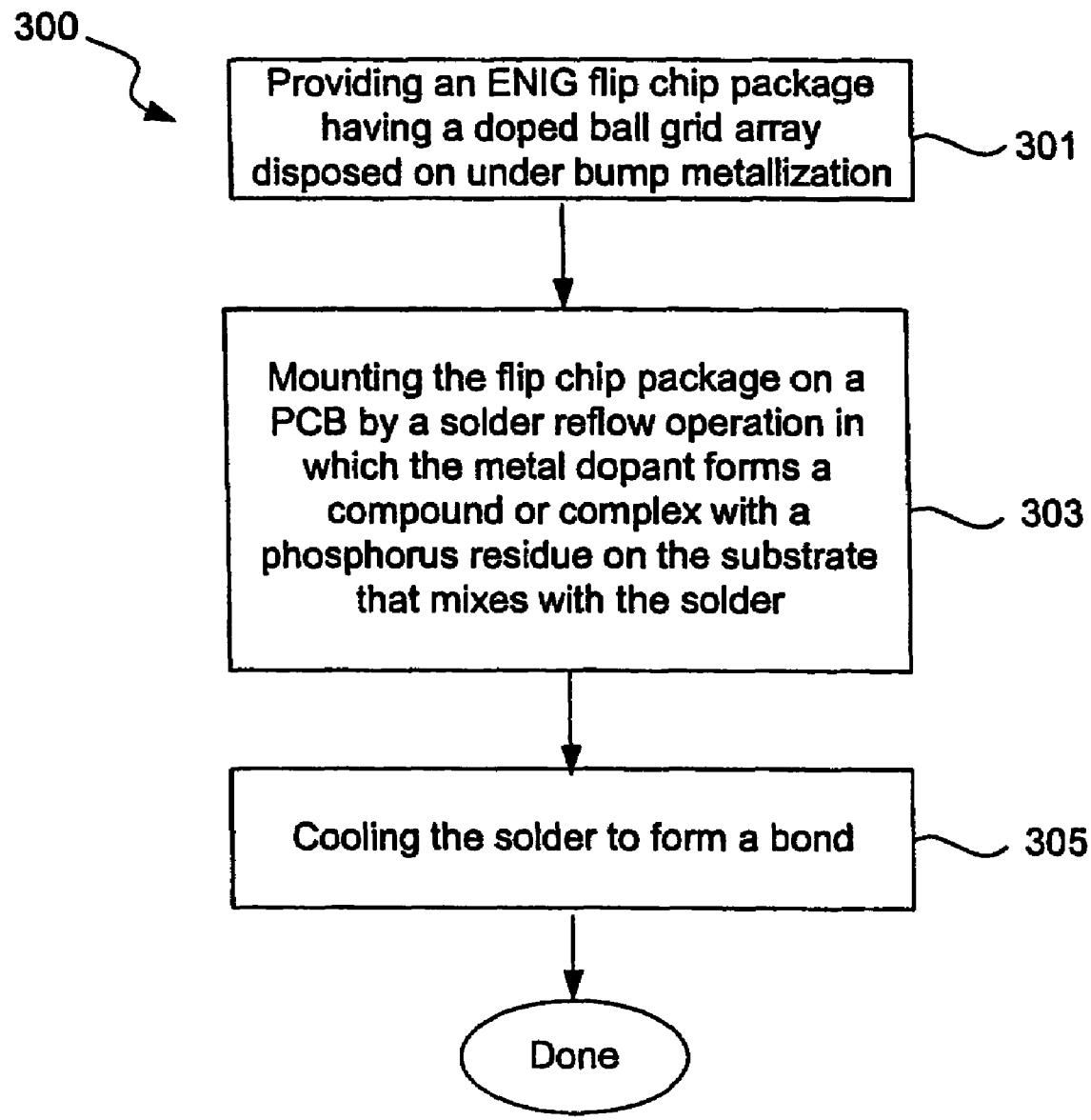
FIG. 3 depicts a flow chart showing stages of a method of making an electronic device in accordance with one embodiment of the present invention.

FIG. 3 depicts a flow chart showing stages of a method of making an electronic device in accordance with one embodiment of the present invention. The method 300 involves providing an electroless nickel immersion gold flip chip package having a doped ball grid array disposed on under bump metallization (301). The solder balls of the array are composed of a Pb/Sn bulk solder and a metal dopant as described above in an amount of at least 0.2% by weight. The dopant is capable of forming a compound or complex with phosphorus. The flip chip package is mounted on a printed circuit board by a solder reflow operation in which the solder is heated above its melting temperature, the metal dopant forms a compound or complex with a phosphorus residue on the substrate that mixes with the solder (303), and a solder bond is formed with electrical contacts on the board upon cooling (305).

Figure 4:
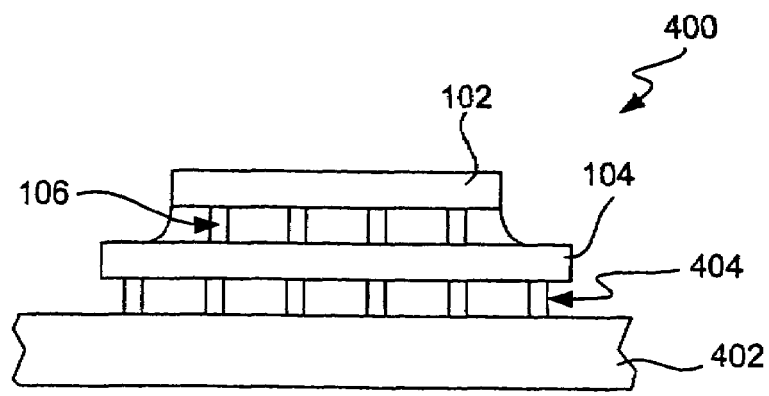
FIG. 4 depicts an electronic device in accordance with one embodiment of the present invention.
Figure 2A:
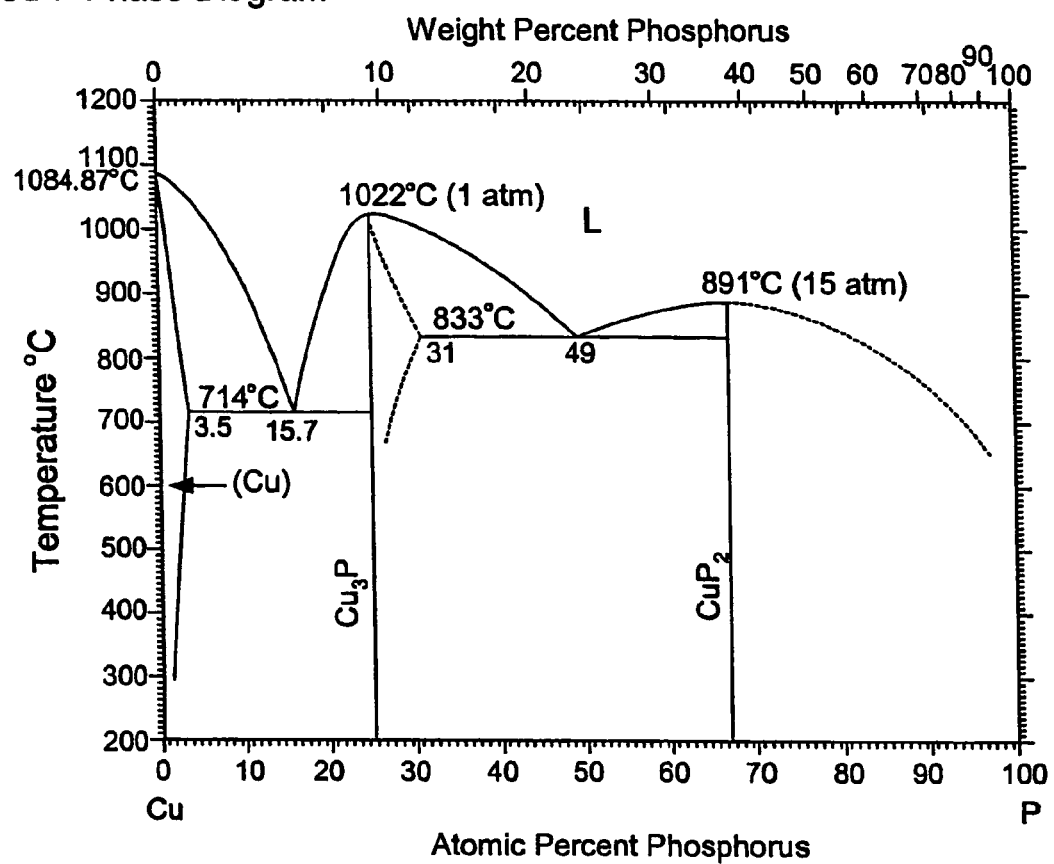
FIGS. 2A-2E depict phase diagrams which illustrate the ability of various dopant materials used in accordance with the present invention to react/complex with phosphorus.
Figure 2B:
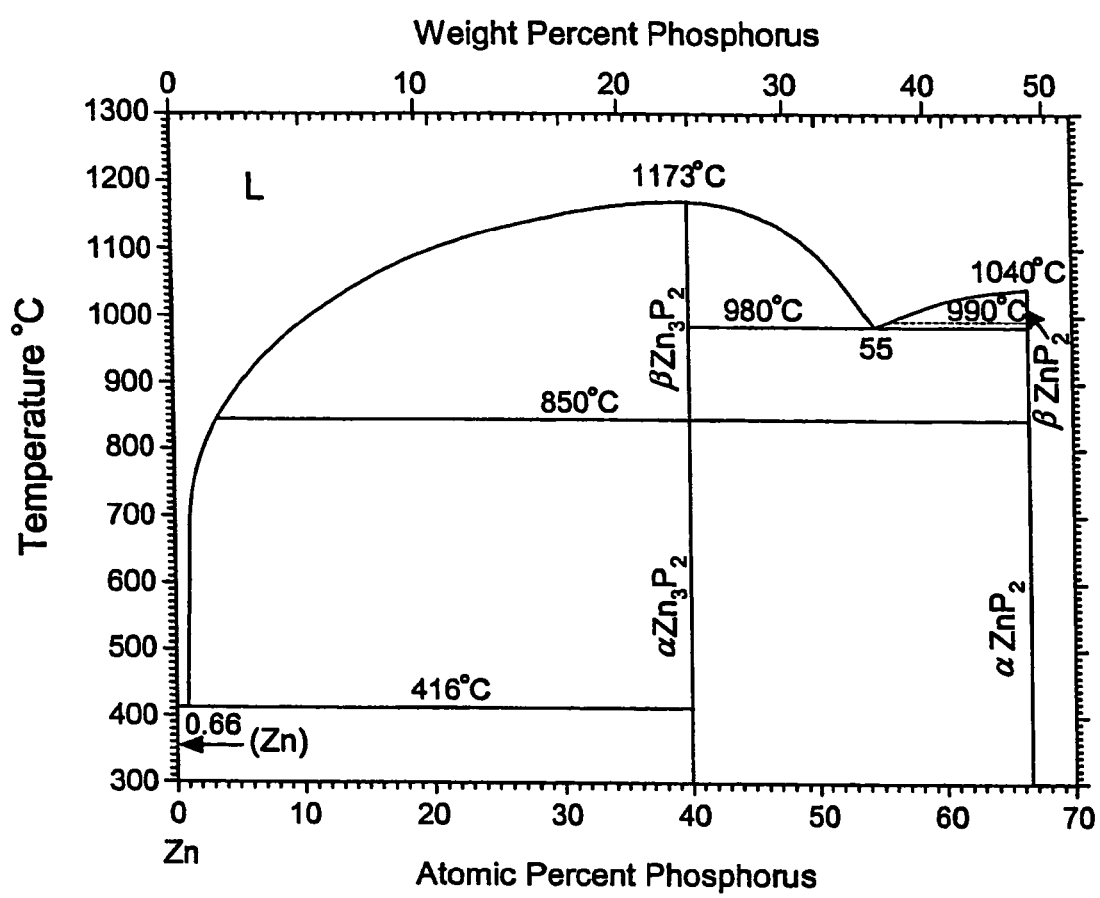
Figure 2C:
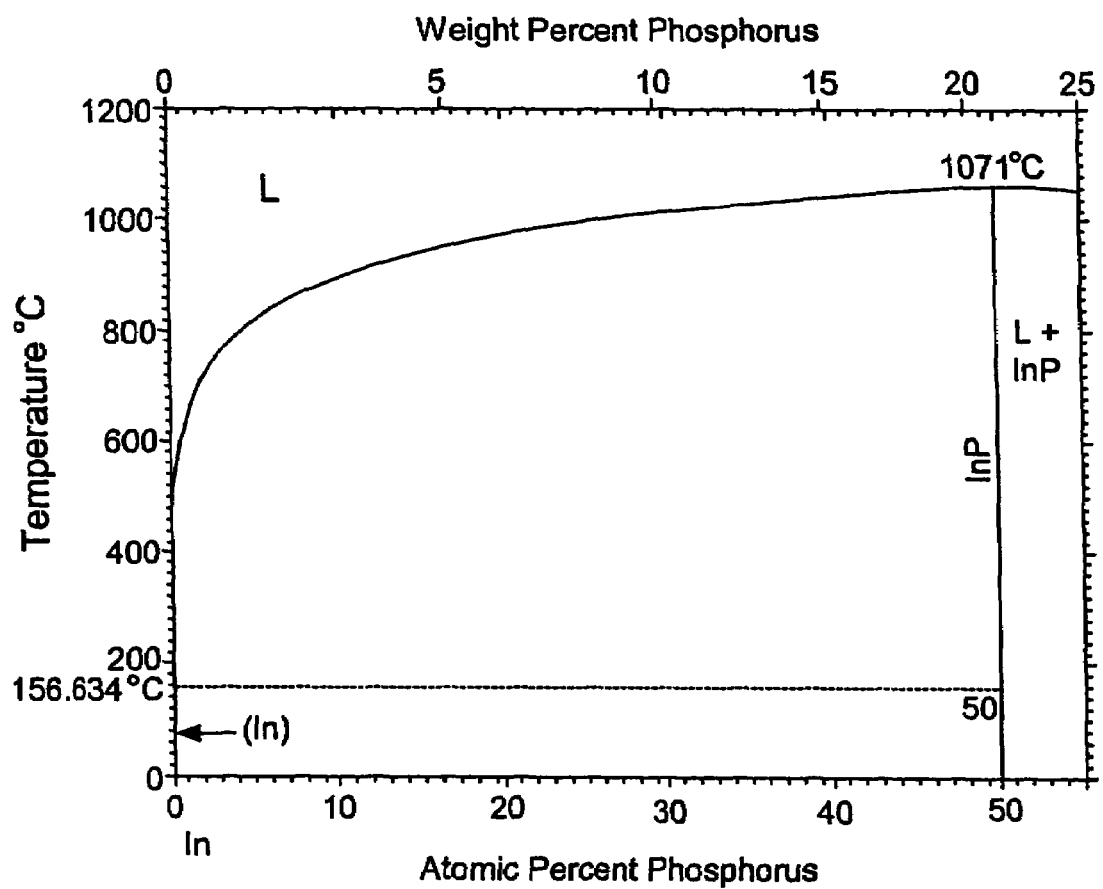
Figure 2D:
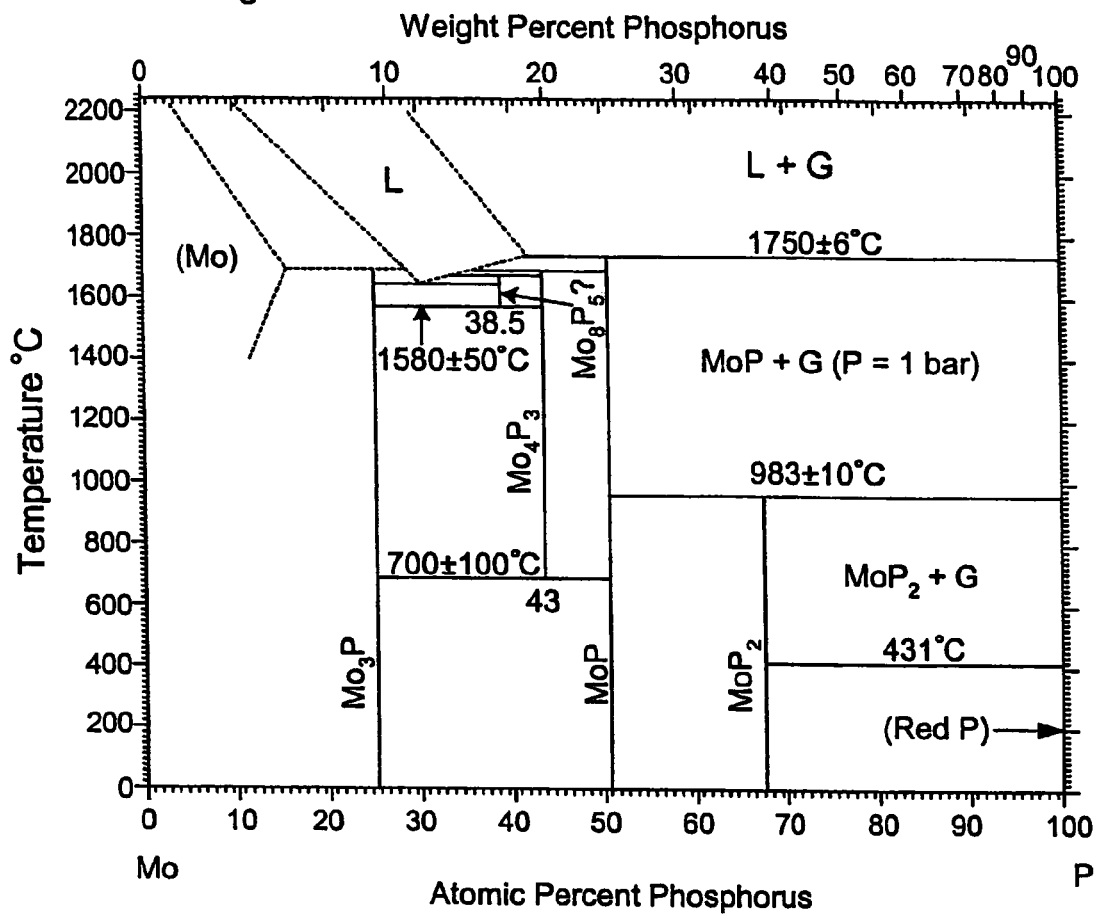
Figure 2E:
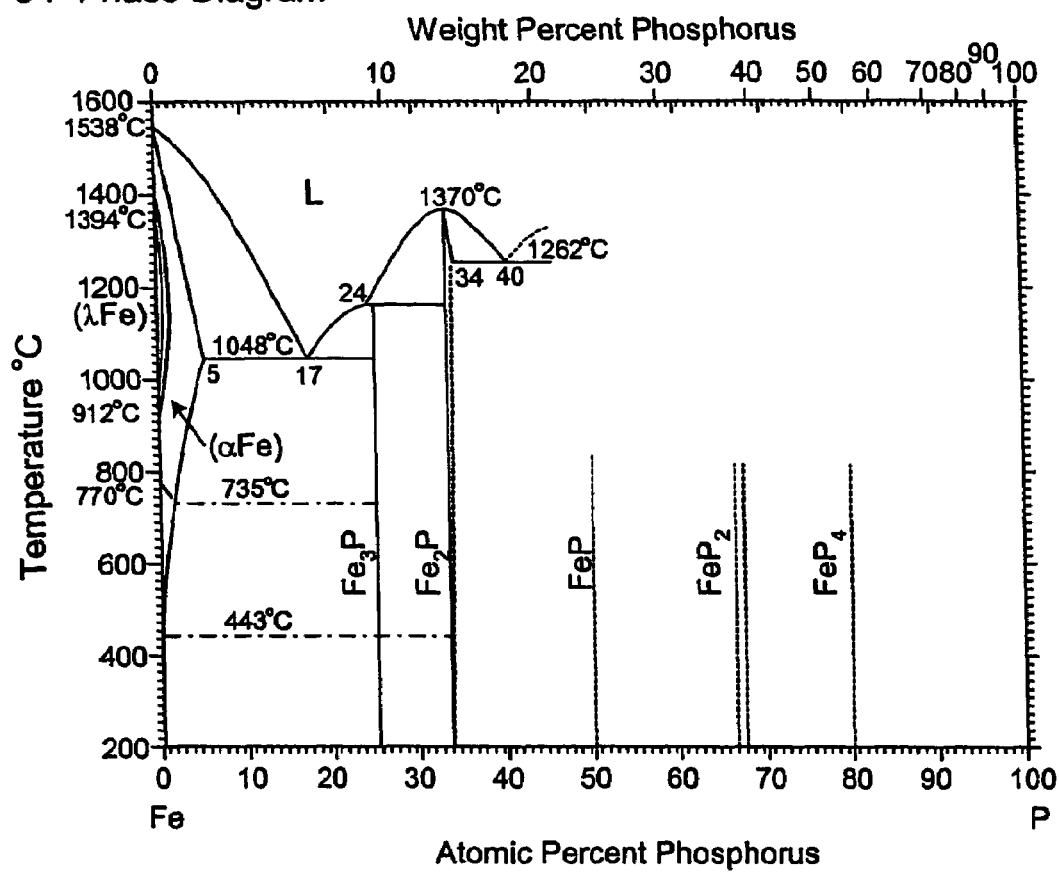

FIG. 4 depicts an electronic device in accordance with one embodiment of the present invention. The device 400 includes a printed circuit board (PCB) 402 on which a package 100, as described above with reference to FIGS. 1A-B, is mounted via solder bonds 404. The package 100 includes a flip chip (die) 102 electrically connected on its active circuit surface to conductive traces on the chip side of an electroless nickel immersion gold packaging substrate 104 by solder bonds 106. An array of doped solder balls (solder ball grid array (BGA)) 110 on the under bump metallization (UBM) of the substrate 104 is converted to solder bonds 304 in a reflow operation to provide electrical bonding between the substrate 104 and the PCB 402.

EXAMPLES

The following examples provide details concerning solder ball compositions useful in semiconductor flip chip packages in accordance with the present invention. It should be understood the following is representative only, and that the invention is not limited by the detail set forth in these examples:

Example 1

Cu-Doped Solder Balls

| | |
|---|---|
| Production Lot No. | PA21210-Cu762 |
| Solder Ball Quantity | 250k |
| Alloy Composition | Sn62Pb36Cu2 |
| Solder Ball Size | 0.762 ± 0.0254 (mm) |

Chemical Composition (Atomic Absorption)

| Element | Actual Composition |
|---|---|
| Sn | 61.940 |
| Pb | Balance |
| Cu | 2.1200 |

Melting Temperature & Specific Gravity

| | Actual Status |
|---|---|
| Melting Temp. (° C.) | 180.86 |
| Specific Gravity | 8.50 |

Dimension Inspection (Profile Projector)

| | |
|---|---|
| Avg. Solder Ball Size (mm) | 0.7619 |
| Standard Deviation | 0.0042 |
| Max. Solder Ball Size (mm) | 0.776 |
| Min. Solder Ball Size (mm) | 0.751 |
| Cp | 2.0069 |
| Cpk | 1.9997 |
| Out of Spec. Criteria (ea) | 0/1,000 |

Visual Inspection (SEM. Stereomicroscope)
No Cracks, no scratches, and no protrusions Example 2

Zn-Doped Solder Balls

| | |
|---|---|
| Production Lot No. | PA21210-Zn762 |
| Solder Ball Quantity | 250K |
| Alloy Composition | Sn62Pb36Zn2 |
| Solder Ball Size | 0.762 ± 0.0254 (mm) |

Chemical Composition (Atomic Absorption)

| Element | Actual Composition |
|---|---|
| Sn | 62.350 |
| Pb | Balance |
| Zn | 2.4000 |

Melting Temperature and Specific Gravity

| | Actual Status |
|---|---|
| Melting Temp. (° C.) | 172.46 |
| Specific Gravity | 7.60 |

Dimension Inspection (Profile Projector)

| | |
|---|---|
| Avg. Solder Ball Size (mm) | 0.7617 |
| Standard Deviation | 0.0045 |
| Max. Solder Ball Size (mm) | 0.774 |
| Min. Solder Ball Size (mm) | 0.750 |
| Cp | 1.8994 |
| Cpk | 1.8786 |
| Out of Spec. Criteria (ea) | 0/1,000 |

Visual Inspection (SEM Stereomicroscope)
No Cracks, no scratches, and no protrusions

Example 3

In-Doped Solder Balls

| | |
|---|---|
| Production Lot No. | PA21210-In762 |
| Solder Ball Quantity | 250k |
| Alloy Composition | Sn62Pb36In2 |
| Solder Ball Size | 0.762 ± 0.0254 (mm) |

Chemical Composition (Atomic Absorption)

| Element | Actual Composition |
|---|---|
| Sn | 63.760 |
| Pb | Balance |
| In | 2.0300 |

Melting Temperature and Specific Gravity

| | Actual Status |
|---|---|
| Melting Temp. (° C.) | 172.25 |
| Specific Gravity | 7.60 |

Dimension Inspection (Profile Projector)

| | |
|---|---|
| Avg. Solder Ball Size (mm) | 0.7614 |
| Standard Deviation | 0.0042 |
| Max. Solder Ball Size (mm) | 0.774 |
| Min. Solder Ball Size (mm) | 0.749 |
| Cp | 2.0220 |
| Cpk | 1.9722 |
| Out of Spec. Criteria (ea) | 0/1,000 |

Visual Inspection (SEM Stereomicroscope)
No Cracks, no scratches, and no protrusions

Example 4

Fe-Doped Solder Balls

| | |
|---|---|
| Production Lot No. | PA21210-Fe762 |
| Solder Ball Quantity | 250k |
| Alloy Composition | Sn62Pb36Fe2 |
| Solder Ball Size | 0.762 ± 0.0254 (mm) |

Chemical Composition (Atomic Absorption)

| Element | Actual Composition |
|---|---|
| Sn | 62.140 |
| Pb | Balance |
| Fe | 2.2000 |

Melting Temperature & Specific Gravity

| | Actual Status |
|---|---|
| Melting Temp. (° C.) | 186.17 |
| Specific Gravity | 7.70 |

Dimension Inspection (Profile Projector)

| | |
|---|---|
| Avg. Solder Ball Size (mm) | 0.7614 |
| Standard Deviation | 0.0044 |
| Max. Solder Ball Size (mm) | 0.776 |
| Min. Solder Ball Size (mm) | 0.750 |
| Cp | 1.9226 |
| Cpk | 1.8788 |
| Out of Spec. Criteria (ea) | 0/1,000 |

Visual Inspection (SEM. Stereomicroscope)
No Cracks, no scratches, and no protrusions

Example 5

Mo-Doped Solder Balls

| | |
|---|---|
| Production Lot No. | PA21210-Mo762 |
| Solder Ball Quantity | 250k |
| Alloy Composition | Sn62Pb36Mo2 |
| Solder Ball Size | 0.762 ± 0.0254 (mm) |

Chemical Composition (Atomic Absorption)

| Element | Actual Composition |
| --- | --- |
| Sn | 64.280 |
| Pb | Balance |
| Mo | 1.5200 |

Melting Temperature & Specific Gravity

|  | Actual Status |
| --- | --- |
| Melting Temp. (° C.) | 186.18 |
| Specific Gravity | 8.70 |

Dimension Inspection (Profile Projector)

| | |
| --- | --- |
| Avg. Solder Ball Size (mm) | 0.7612 |
| Standard Deviation | 0.0042 |
| Max. Solder Ball Size (mm) | 0.776 |
| Min. Solder Ball Size (mm) | 0.750 |
| Cp | 2.0259 |
| Cpk | 1.9646 |
| Out of Spec. Criteria (ea) | 0/1,000 |

Visual Inspection (SEM. Stereomicroscope)

No Cracks, no scratches, and no protrusions

All references cited herein are incorporated by reference in their entirety and for all purposes.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A method of making an electronic apparatus, comprising:
providing an electroless nickel immersion gold flip chip package having a doped ball grid array disposed on under bump metallization, wherein the solder balls of the array comprise,
a Pb/Sn bulk solder, and
a metal dopant selected from the group consisting of Al and Ni in an amount of at least 0.2% by weight;
mounting the flip chip package on a printed circuit board by a solder reflow operation.

2. The method of claim 1, wherein the solder reflow operation comprises heating the solder of the ball grid array above its melting temperature.

3. The method of claim 2, wherein during the solder reflow operation the metal dopant forms a compound or complex with a phosphorus residue on the substrate that is mixable with the bulk solder, and a solder bond is formed between the under bump metallization of the package and electrical contacts on the board upon cooling.

4. The method of claim 1, wherein the metal dopant in the bulk solder strengthens the interfacial bond between the solder and the under bump metal metallization of the substrate relative to undoped bulk solder.

5. The method of claim 1, wherein the metal dopant is in an amount of about 0.2% to 2.5% by weight.

6. The method of claim 5, wherein the metal dopant is Al.

7. The method of claim 5, wherein the metal dopant is Ni.

8. The method of claim 1, wherein the metal dopant is Al.

9. The method of claim 1, wherein the metal dopant is Ni.

10. The method of claim 1, wherein the under bump metallization comprises vias filled with successive layers of copper, nickel and gold.

11. A method of mounting an electroless nickel immersion gold flip chip package, comprising:
positioning on a substrate an electroless nickel immersion gold flip chip package having a doped ball grid array disposed on under bump metallization, wherein the solder balls of the array comprise,
a Pb/Sn bulk solder, and
a metal dopant selected from the group consisting of Al and Ni in an amount of at least 0.2% by weight;
forming an electrical connection between the electroless nickel immersion gold flip chip package and the substrate by a solder reflow operation.

12. The method of claim 11, wherein the substrate is a printed circuit board.

13. The method of claim 11, wherein the metal dopant is in an amount of about 0.2% to 2.5% by weight.

14. The method of claim 11, wherein the metal dopant is Al.

15. The method of claim 11, wherein the metal dopant is Ni.

16. A method of strengthening an interfacial solder/under bump metallization bond for an electroless nickel immersion gold flip chip package, comprising:
doping a Pb/Sn bulk solder with a metal dopant selected from the group consisting of Al and Ni in an amount of at least 0.2% by weight;
applying a solder ball grid array to the electroless nickel immersion gold flip chip package, the solder ball grid array comprising the doped Pb/Sn bulk solder; and
forming an electrical connection between the electroless nickel immersion gold flip chip package and a substrate by a solder reflow operation.

17. The method of claim 16, wherein the substrate is a printed circuit board.

* * * * *